(12) United States Patent
Zrilic

(10) Patent No.: US 10,110,246 B1
(45) Date of Patent: Oct. 23, 2018

(54) Δ-Σ METHODS FOR FREQUENCY DEVIATION MEASUREMENT OF KNOW NOMINAL FREQUENCY VALUE

(71) Applicant: Djuro G. Zrilic, Santa Fe, NM (US)

(72) Inventor: Djuro G. Zrilic, Santa Fe, NM (US)

(73) Assignee: Djuro G. Zrilic, Santa Fe, NM (US)

( * ) Notice: Subject to any disclaimer, the term of this patent is extended or adjusted under 35 U.S.C. 154(b) by 0 days.

(21) Appl. No.: 15/732,173

(22) Filed: Sep. 29, 2017

(51) Int. Cl.
*H03M 3/00* (2006.01)
(52) U.S. Cl.
CPC ..................... *H03M 3/30* (2013.01)
(58) Field of Classification Search
CPC ..................................... H03M 3/30
USPC ..... 341/143, 144, 155, 76, 77; 375/247, 248
See application file for complete search history.

(56) References Cited

U.S. PATENT DOCUMENTS

| | | | |
|---|---|---|---|
| 3,775,734 A | 11/1973 | Bealor, Jr. et al. | |
| 8,956,592 B2 | 2/2015 | Manson | |
| 9,141,339 B2 | 9/2015 | Zrilic | |
| 9,279,411 B2 | 3/2016 | Beekmann et al. | |
| 9,525,430 B1 | 12/2016 | Zrilic | |
| 9,575,729 B1 | 2/2017 | Zrilic | |
| 2006/0115005 A1* | 6/2006 | Hickling | H03C 3/40 375/247 |
| 2014/0159929 A1* | 6/2014 | Zrilic | G06F 7/602 341/143 |

OTHER PUBLICATIONS

DJ. Zrilic, N. Pjevalica, Frequency Deviation Measurement Based on Two-Arm Δ-Σ Modulated Bridge, IEEE Tr. On I&M, vol. 53, No. 2, Apr. 2004, pp. 293-299.
T.S. Sidhu, Accurate Measurement of Power System Frequency Using a Digital Signal Processing Technique, IEEE Tr. On I&M, vol. 48, No. 1, Feb. 1999, pp. 75-81.
L E. Banta, Y. Xia, A ROM-Based High Accuracy Line Frequency and Line Deviation Meter, IEEE Tr. On I&M, vol. 39, No. 3, Jun. 1990, pp. 533-539.
A. Nemat, A High Resolution Digital Frequency Meter for Low Frequencies, IEEE Tr. On I&M, vol. 39. No. 4, Aug. 1990, pp. 667.
M. I. Irshid, W. A. Shahab, B. R. El-Asir, A Simple Programmable Frequency Meter for Low Frequencies with Known Nominal Values, IEEE Tr. On I&M, vol. 40, No. 3, Jun. 1991, pp. 640-642.
N. Kouvaras, Operations, on Delta-Modulated Signals and Their Applications in the Realization of Digital Filters, The Radio and Electrical Engineering, Sep. 1978, No. 9, pp. 431-438.
DJ. Zrilic, G. Petrovic, W. Tang, Novel Solutions of Delta-Sigma Based Rectifying Encoder, Paper accepted for publication in IEEE Tr. On CAS II, in 2017.

(Continued)

*Primary Examiner* — Peguy Jean Pierre

(57) ABSTRACT

Disclosed are three methods for precise measurement of frequency deviation of known nominal frequency. Delta adder method (DA), comprising of delta-sigma modulator, delta-adder, delay line, low-pass filter, and zero crossing detector. The second method (DA+RE), comprising of delta-sigma modulator, circuit for squaring delta-sigma bit-stream, delta-adder, low-pass filter, and zero-crossing detector. The third method comprises of reference delta-sigma modulator for synchronization of two or more dislocated frequency sources of known nominal frequency.

3 Claims, 11 Drawing Sheets

(56) References Cited

OTHER PUBLICATIONS

Atmel Application Not, Digital Frequency/Phase Comparator, AT6000 Series.

A.S. Nizamani, Novel Frequency Comparator: Application in Frequency Meters and in Difference Clocks for Generator Frequency Error Monitors, IEEE Tr. On I&M, vol. 40, No. 1, Feb. 1996, pp. 320-323.

C.T. Nguyen, K. Drinivansan, A New Technique for Rapid Tracking of Frequency Deviation Based on Level Crossing, IEEE Tr. On Power Aparatus and Systems, vol PAS-103, No. 8, Aug. 1984, pp. 2230-2236.

T. Kaspiris, N. Loulgaris, C. Halkin, A Method for the Precise Measurement of the Difference Between Two Low Frequencies, IEEE Tr. On I&M, vol. IM-34, No. 1, Mar. 1985, pp. 95-96.

M. Begovic, P. Djuric, S. Dunlop, A. Phadke, Frequency Tracking in Power Networks in the Presence of Harmonics, IEEE Tr. On Power Delivery, vol. 8, No. 2, Apr. 1993, pp. 480-486.

J. Dwivedi, M. Shukla, K. Verma, R. Singh, A Novel Technique for Indication of Power Frequency Deviation in Electric Systems, PEIE 2010, CCIS 102, pp. 80-82, Springer Verlag, Berlin.

Y. Chen, T. Chien, A Simple Approach for Power Signal Frequency Determination on Virtual Internet Platform, Applied Mathematics &Information Science 9, No. 1L, 2015, pp. 65-71.

S. J. Arif, A Simple and Efficient Method for Accurate Measurement and Control of Power Frequency Deviation, International Journal on Electrical and Computer, Energetic, Electronic and Engineering, vol. 10, No. 6, 2016.

M. Ahmad, Power System Frequency Deviation Measurement Using an Electronic Bridge, IEEE Tr. On I&M, vol. 37, No. 1, Mar. 1988, pp. 147-148.

\* cited by examiner

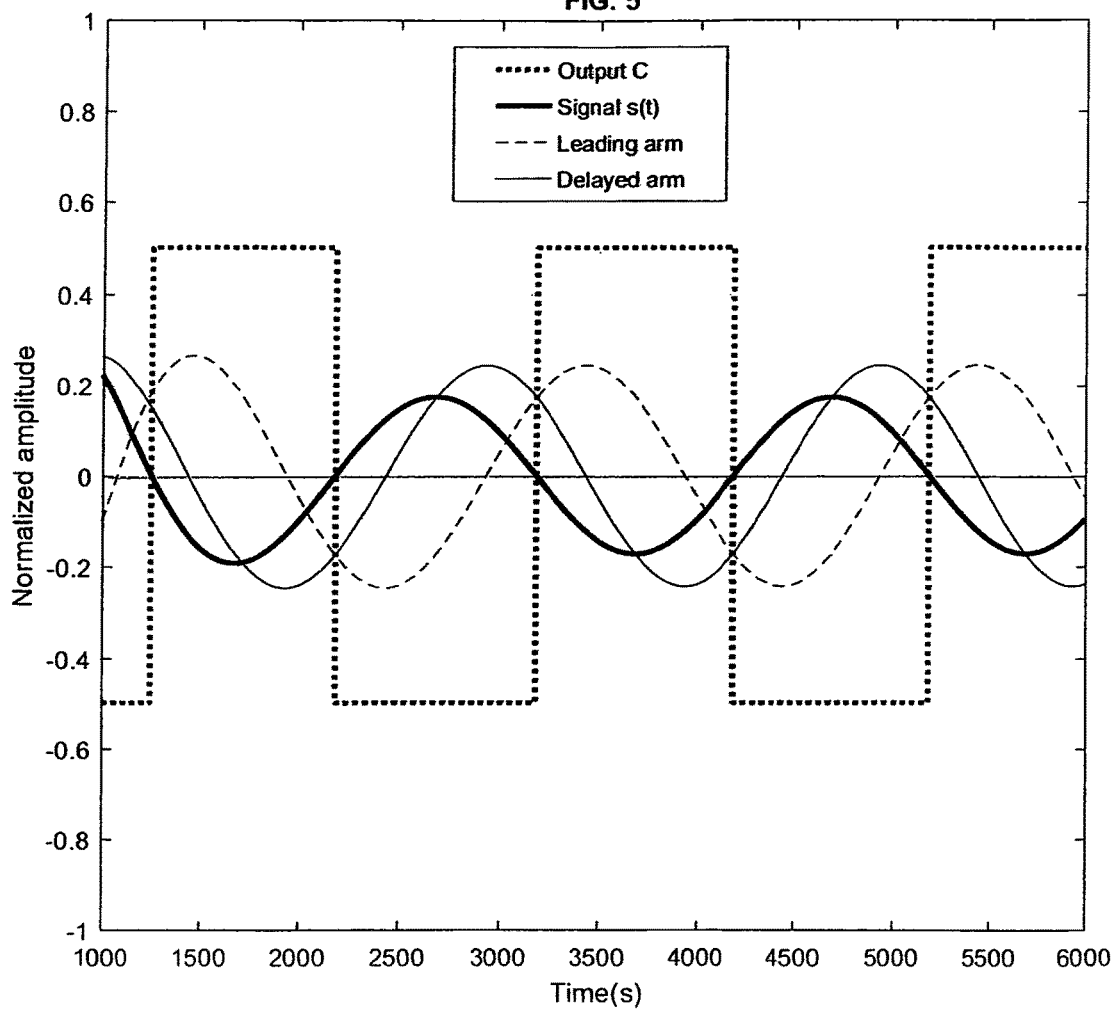

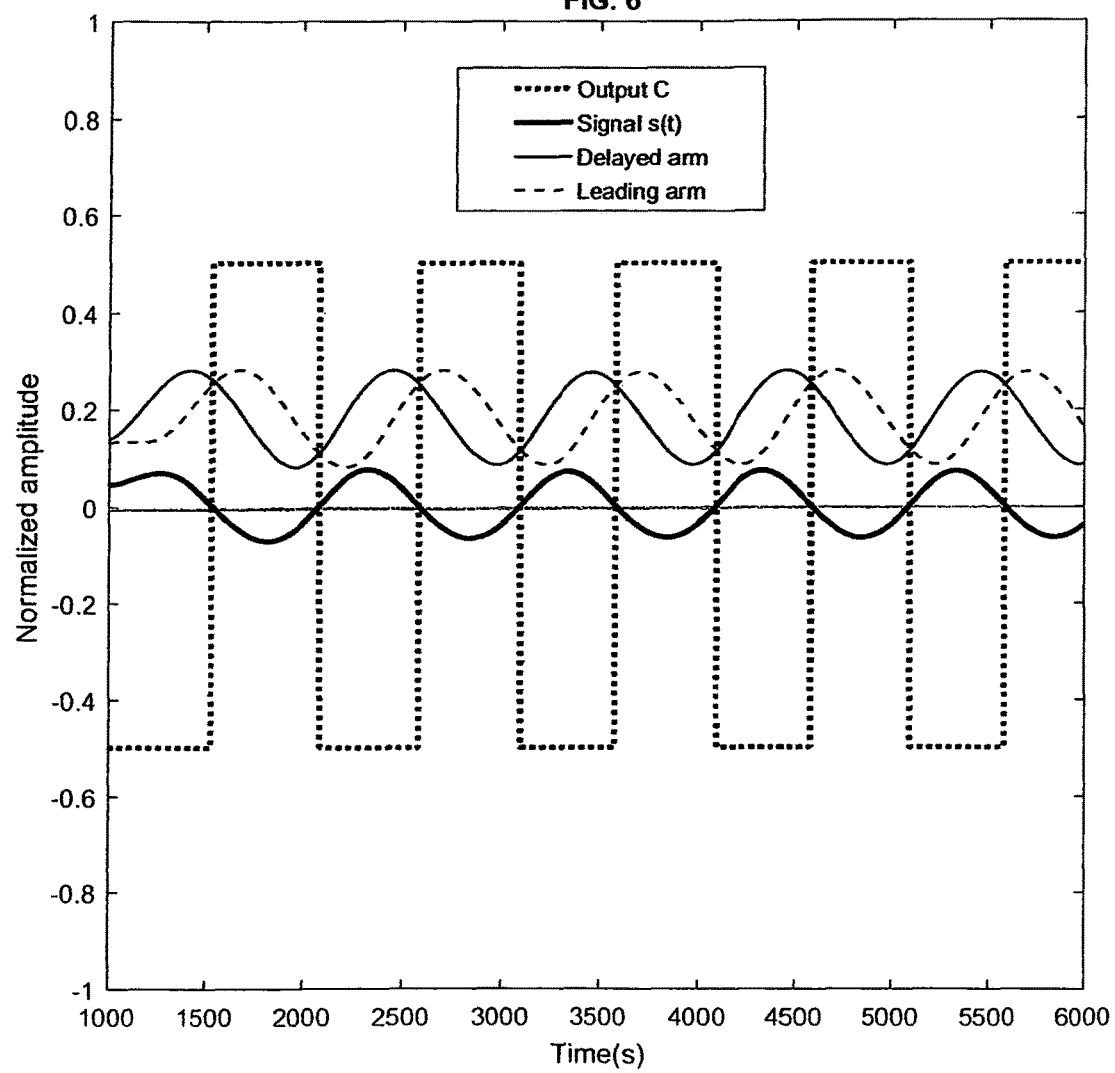

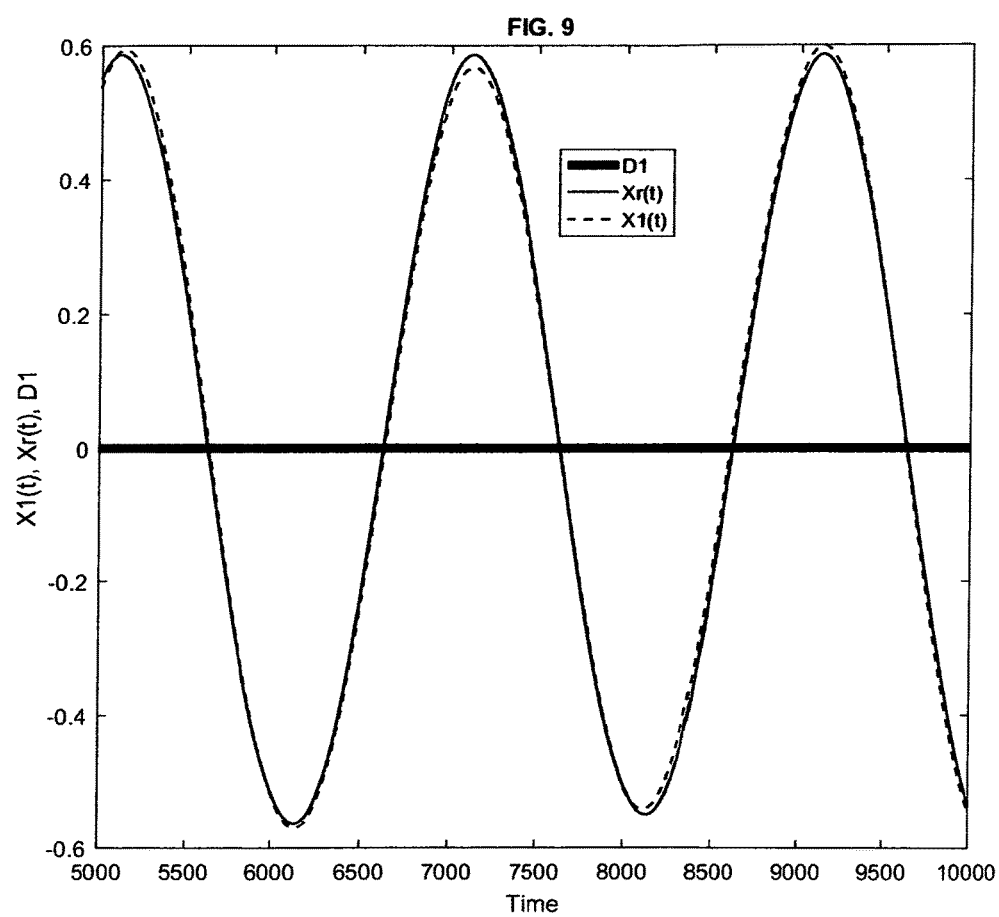

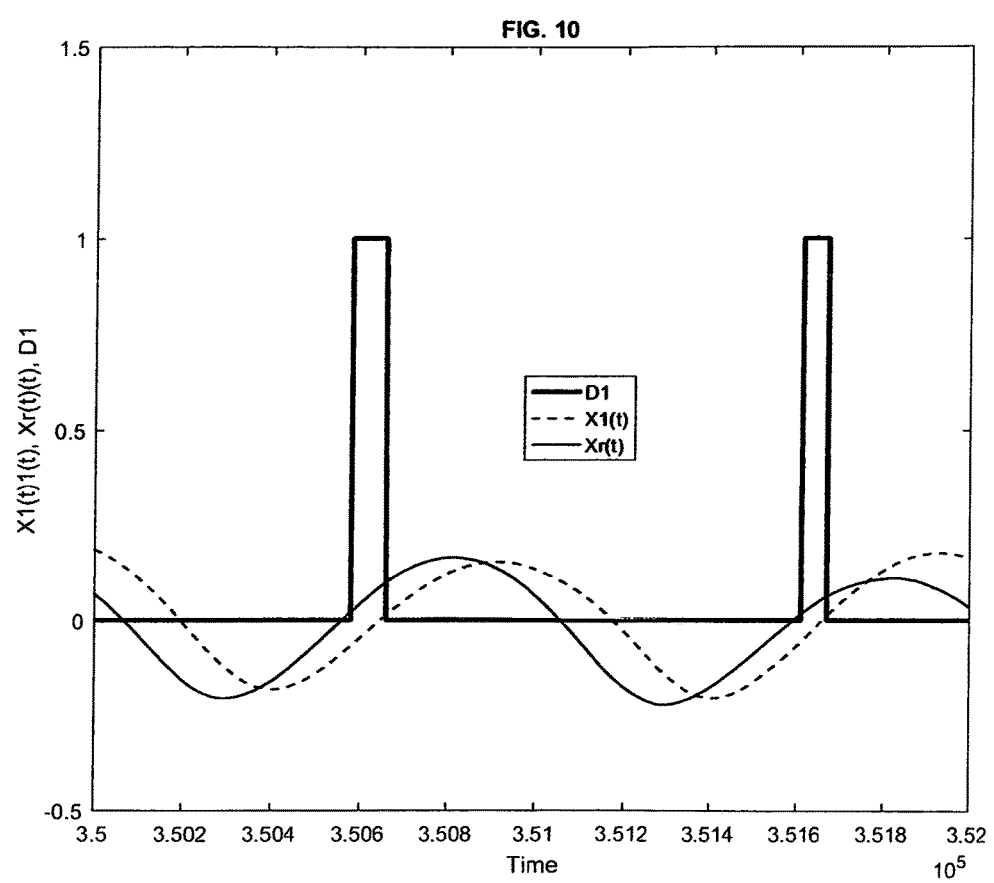

Δ-Σ METHODS FOR FREQUENCY DEVIATION MEASUREMENT OF KNOW NOMINAL FREQUENCY VALUE

CROSS REFERENCES TO RELATED APPLICATIONS

None.

STATEMENT REGARDING FEDERALLY SPONSORED R&D

These research results are not sponsored by Government grants.

NAME OF PARTIES TO A JOINT RESEARCH AGREEMENT

None.

BACKGROUND OF THE INVENTION

Field of Invention

Frequency fluctuation in many electronics systems is an undesired phenomenon. For normal operation of the system, the system frequency is kept near a set value. In reality it fluctuates and it is necessary to keep it within certain bounds. Here, three new methods, for frequency deviation measurement of known nominal frequency value, are proposed. Both methods are based on direct processing of Δ-Σ modulated bit-stream. Thus, the field of the present invention relates to linear and non-linear direct processing of Δ-Σ modulated bit-stream (Δ-Σ signal processing). It belongs to a wider class of digital signal processing (DSP) in the electrical engineering field.

Description of Prior Art

Telecommunication and electric power systems are the two manmade dynamic systems. Reliability of these systems is of the greatest importance for the security and economic well-being of modern society. These systems extend over thousands of kilometers, and their protection and stable operation requires enormous investment. To ensure stable and reliable operations many system parameters have to be monitored. One of the most important parameters in power systems is the frequency. Frequency variation can affect system operation considerably. In power systems the supply and demand must be in balance. The frequency of the power source is related to the current drawn by different loads of the grid. Both effects, overload and underload, are undesirable. Thus, it is very important that the frequency of a power system is maintained very close to its nominal frequency. There are several methods, proposed in the past for frequency deviation monitoring in power systems.

In reference [1] the authors proposed a frequency computation technique suitable for single or three phase voltage signals. This method is using a level crossing detector which yields several estimates of the frequency within one cycle.

In reference [2] authors proposed a method for the precise measurement of the difference between two low frequencies. The method is based on multiplying the two incoming frequencies by a large factor. They offer a simple and inexpensive solution for a frequency difference meter.

The authors of reference [3] offer three novel techniques for frequency measurement in power networks in the presence of harmonics. All three algorithms, zero crossing, DFT method, and phase demodulation method were tested and verified by simulations.

A relatively simple method for measuring and display of the line frequency deviation, from its nominal value is proposed in reference [4]. This counting method is based on multiplication of the reference and measured signals.

The zero-crossing technique for the purpose of frequency determination of a power signal is presented in reference [5]. The Fourier algorithm is used for digital filtering. The verification of the proposed algorithm is done using a DAQ device in conjunction with LabVIEW.

S. J. Arif [6] proposed the use of a zero-crossing detector to produce pulse train which is combined digitally with a clock of 10 KHz, and then passed through a decade counter to give the unique contribution of pulses which are encoded and displayed. This method offers a resolution of 0.5 Hz.

The use of a two-arm bridge for frequency deviation measurement is proposed in reference [7]. It is an analog implementation, which uses the principle of orthogonality. This system is sensitive to input amplitude variation and additive noise as well.

The use of the two-arm bridge, based on use of Δ-Σ modulation, is proposed in reference [8]. Orthogonality is based on use of an analog integrator. Thus, this system is sensitive to input amplitude variation as well.

A DSP technique is proposed in reference [9]. It uses a microcomputer and data acquisition card. It offers an accurate estimate of the order of 0.02 Hz for nominal, near-nominal, and off-nominal frequencies.

A ROM-based frequency deviation meter is proposed in reference [10]. It consists of two look-up tables and complex timing and control circuits. It offers near 1 mHz resolution for indoor installation with near constant temperature.

The experimental circuit discussed in [11] uses PLL for multiplication of 50 or 60 Hz frequencies by 100. It has a resolution of 0.01 Hz.

A programmable frequency meter for low frequencies with known nominal value is proposed in [12]. The percentage of error is 0.174% for 50 Hz.

A flexible programmable circuit for generation a radio frequency signal for transmission is proposed in US Patent No: 2006/011595 A1. This digital modulation scheme uses the well-known principle of carrier orthogonality. It is known in theory and practice as a quadrature modulation. A proposed delta-sigma transmitter consists of a quadrature digital clock generator, two delta modulators, a pair of commutators (multipliers), analog summing amplifier, bandpas filter (BPF), and antenna. Input to the system is N-bit digital word generated by a controller (micro-processor). One-bit commutator is implemented using exclusive OR (XOR) gate. The quadrature clock generator is implemented using master-slave "D" flip-flop (or a four-stage ring oscillator). A 90-degree phase difference needs only to be approximately 90-degrees. A clock frequency of a phase generator must be greater than 1 MHz (even order of GHz) to shift a information in desired radio frequency bandwidth. Transmitted signal is arbitrary, and a knowledge of frequency of a source is not required. Thus, this invention is meant for the transmission of information, not for instrumentation i.e., detection of deviation of known nominal frequency value.

The first essential component for linear processing of Δ-Σ bit-stream is a delta adder (DA) proposed by Kouvaras [13]. DA adder is, in fact, binary adder with interchanged roles of Sum and Carry Out terminals.

The second vital component, used in this invention, is a rectifying encoder (RE) [14], which can serve as a squaring circuit operator as well [U.S. Pat. No. 9,141,339 B2].

BRIEF SUMMARY OF THE INVENTION

The present invention introduces three novel methods for frequency deviation measurement of known nominal value. All methods are based on direct processing of Δ-Σ bit-stream. The present invention includes:

Method and apparatus which uses the delta adder (DA) and the principle of orthogonality of Δ-Σ bit stream.

Method and apparatus which uses the squaring circuit (RE), DA and the principle of orthogonality of RE bit-stream.

Method and apparatus for synchronization of two or more independent frequency sources of known nominal frequency value.

It is therefore a primary objective of the present invention to provide two methods for accurate deviation frequency measurement.

It is another objective of the present invention to provide simple and reliable digital circuits which will significantly enhance applications of Δ-Σ based frequency meter in different application areas.

It is still another objective of the present invention to reduce power consumption of Δ-Σ processing elements in applications where power consumption is a critical factor.

It is still a future objective of the present invention to provide a simple, inexpensive and programmable IC.

It is still a future objective to design the system on a chip (SoC) which includes sensor, Δ-Σ analog to digital converter (ADC) and a newly proposed circuitry for frequency deviation measurement of known nominal frequency value.

It is still the future objective to design an apparatus for synchronization of two or more independent frequency sources of known nominal frequency, which could be in different geographical areas.

BRIEF DESCRIPTION OF DRAWINGS

FIG. 5 shows the operational waveforms of Δ-Σ method (switch in position A): demodulated orthogonal Δ-Σ bit-stream (two sinusoidal signals shifted for 90°), demodulated output s(t) of DA, and the digital output of comparator circuit, digital signal C.

FIG. 6 shows the operational waveforms of RE+DA method (switch in position B): demodulated two orthogonal squared Δ-Σ bits-streams, demodulated output s(t) of DA, and digital output of comparator circuit, digital signal C.

FIG. 9 shows the waveforms when dislocated generator frequency F1 is synchronized with reference generator frequency Fr.

FIG. 10 shows the waveforms when generator of frequency F1 is out of synchronization.

DETAILED DESCRIPTION OF THE INVENTION

Definition

Implementation of the proposed methods is based on the addition and squaring operation on orthogonal Δ-Σ modulated bit-stream. Thus, operation of these circuits is based on linear and non-linear operations on orthogonal Δ-Σ bit-streams, in order to detect violation of orthogonality law when signal of known nominal frequency value changes.

BEST MODE OF INVENTION

Figure 1:
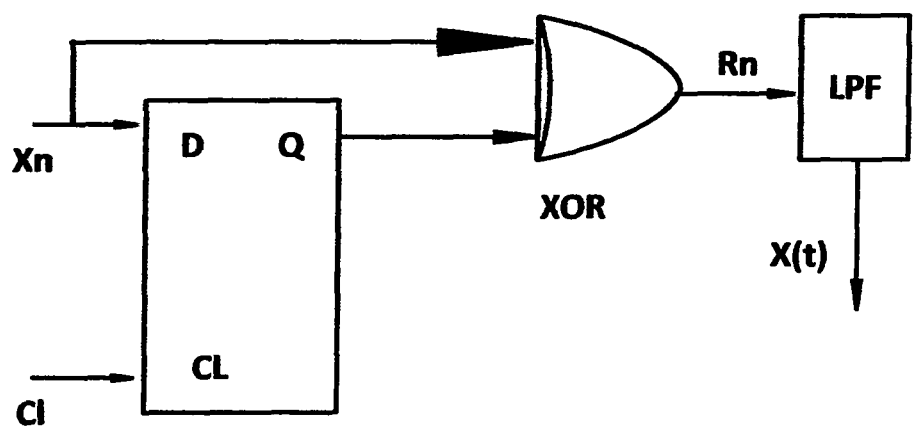
FIG. 1 (Prior Art) presents logic circuits of rectifying encoder (RE). Depending on the bandwidth of low-pass filter (LPF) in FIG. 1 RE can operate as a rectifier or squarer.
Figure 2:
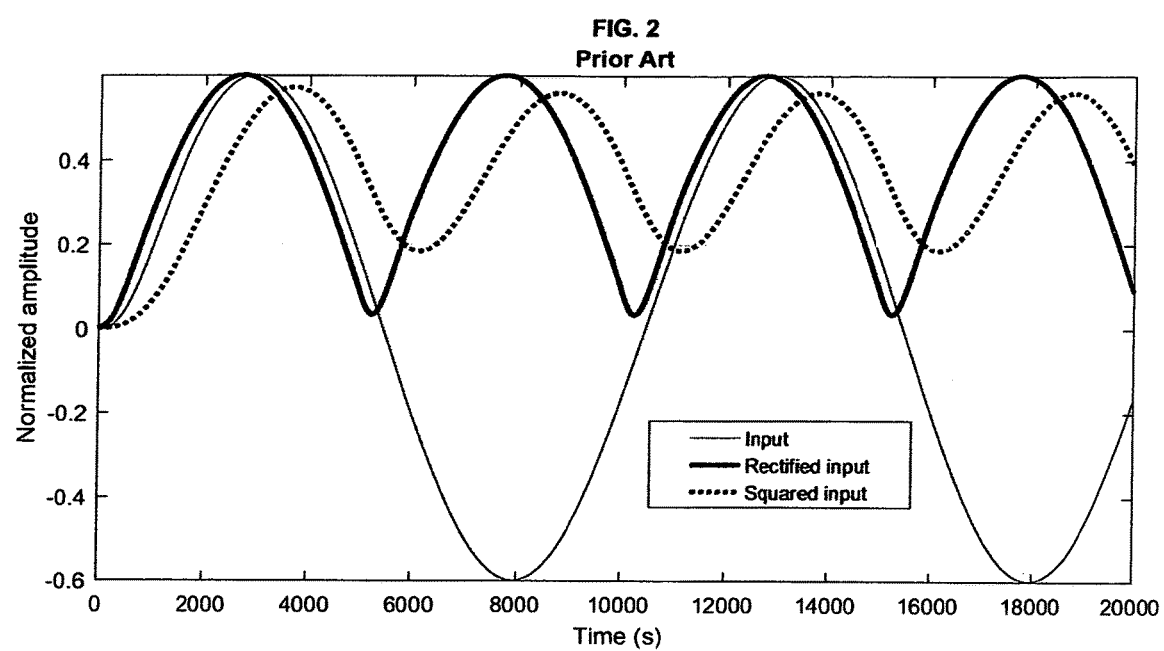
FIG. 2 (Prior Art) shows demodulated rectified and squared waveforms when sinusoidal input signal is Δ-Σ modulated, and its bit-stream Xn is applied to RE. A low-pass filter is used as a demodulator of a bit-stream Rn.
Figure 3:
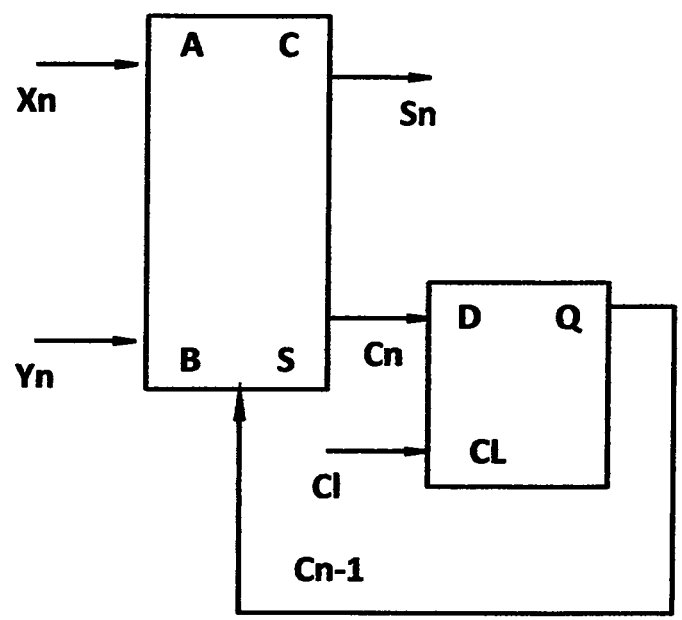
FIG. 3 (Prior Art) shows binary DA proposed by Kouvaras [13].
Figure 4A:
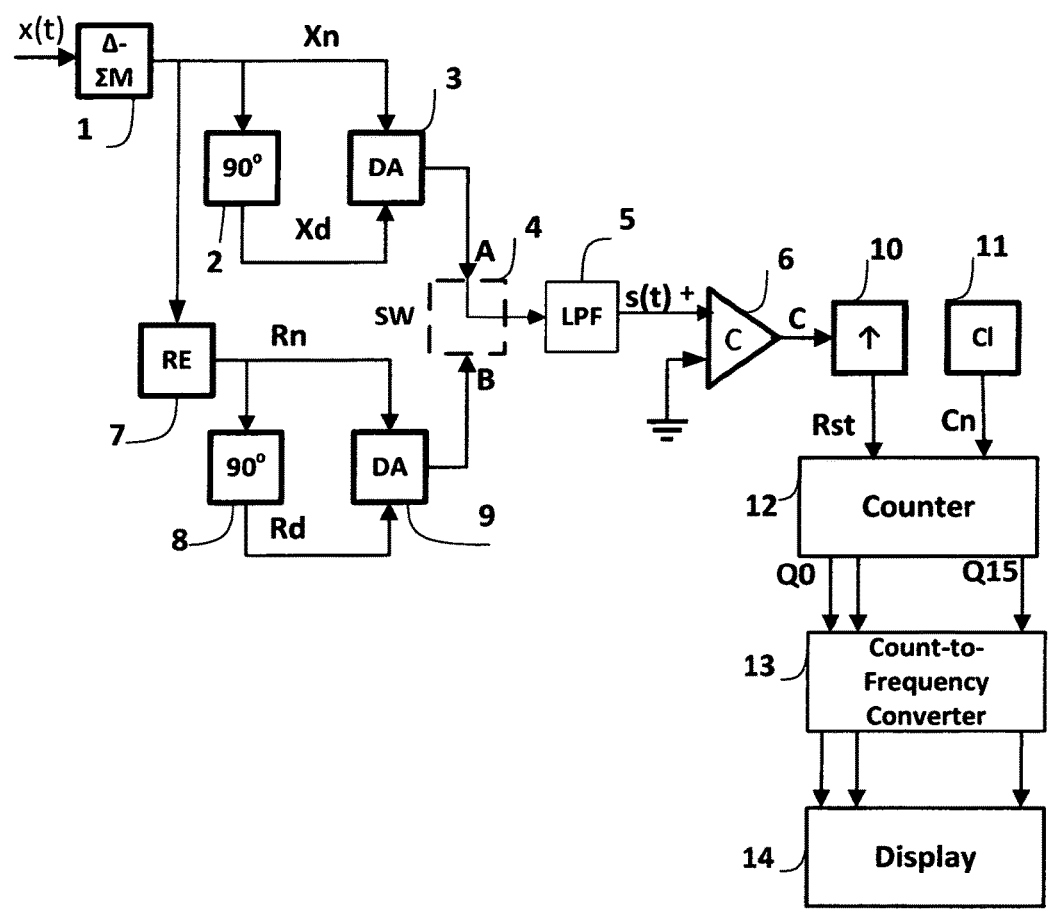
FIG. 4A shows the proposed block diagram of the invention. It consists of two independent methods: DA method (switch 4 in position A), and RE+DA method (switch 4 in position B).
Figure 8:
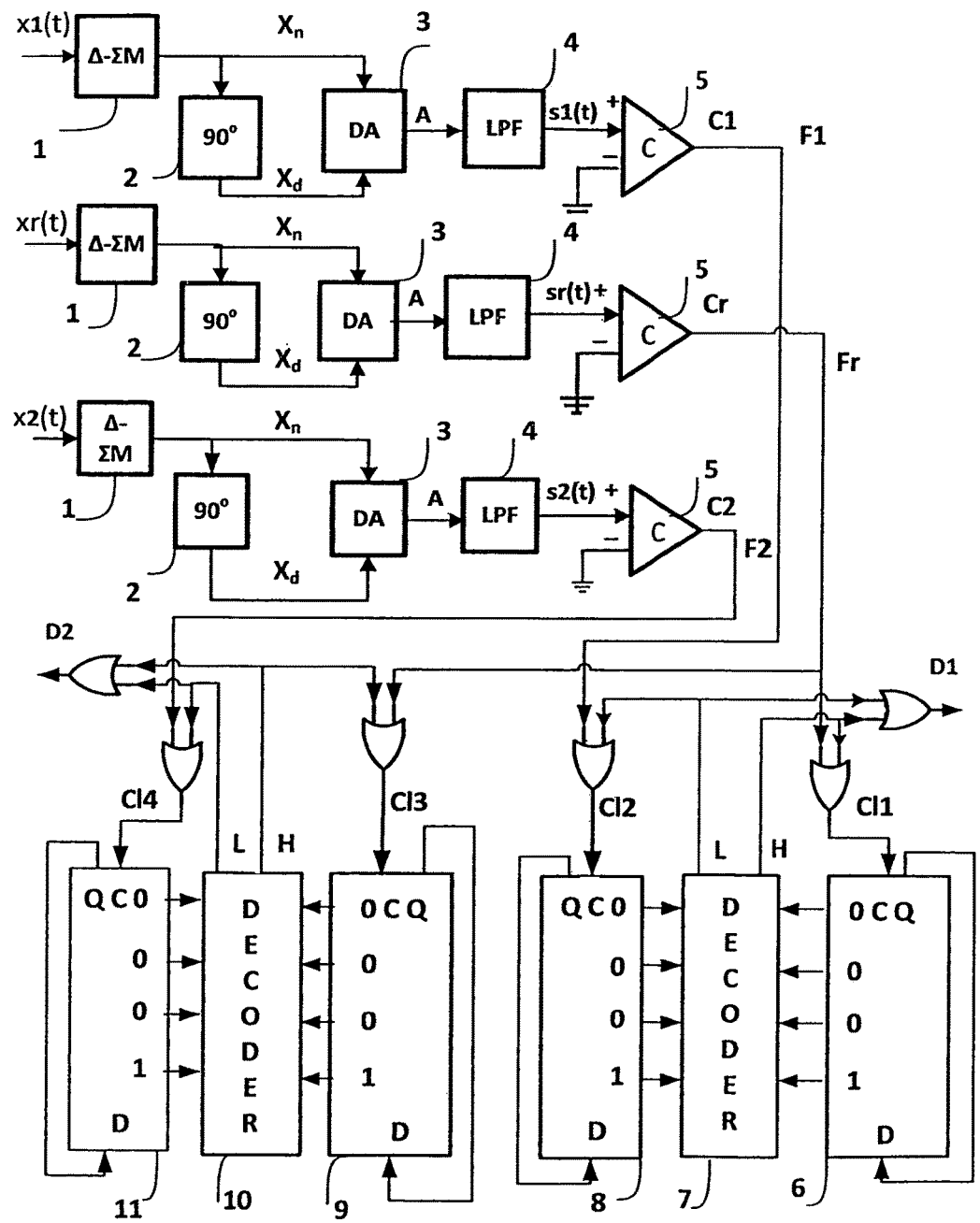
FIG. 8 shows a block diagram of synchronization of two or more frequency generators of known nominal frequency.

In FIG. 4A two independent inventions are presented, and in FIG. 8 one independent invention is presented; herein shall be presented the best mode contemplated by the inventor.

HOW TO MAKE THE INVENTION

As can be amply seen from the drawings, every circuit presents an independent invention. Thus, it is necessary to describe every invention separately.

Figure 4B:
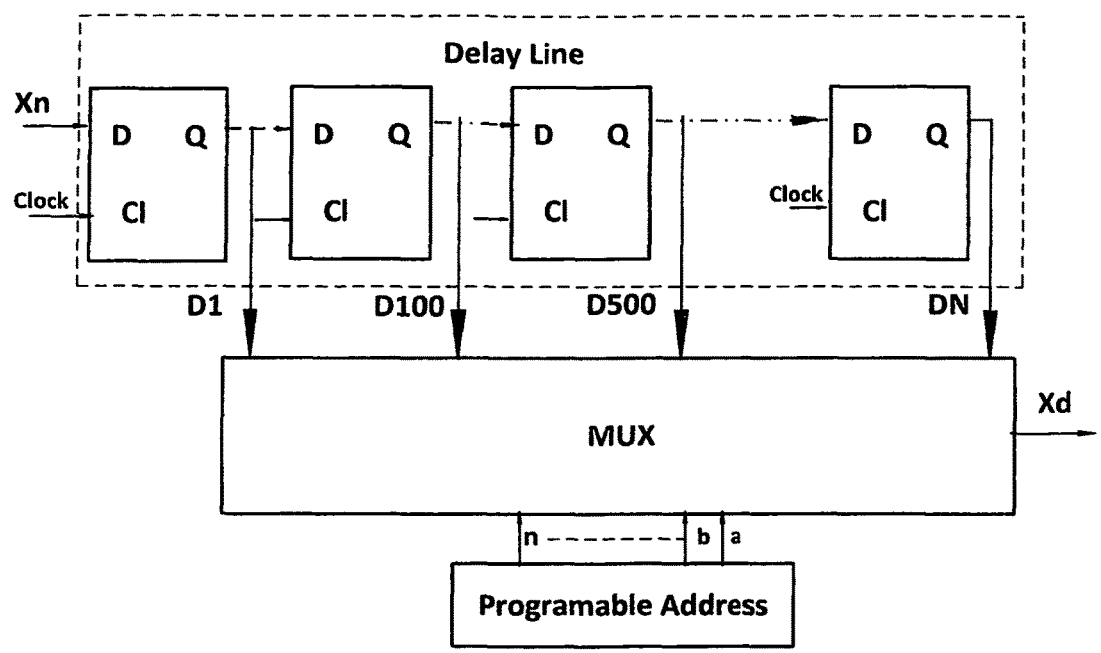
FIG. 4B shows an example of implementation of a programmable 90-degree shift circuit using a programable delay line.

FIG. 4A (switch 4 in position A) shows a block diagram of a DA method. Analog input signal, of known nominal frequency, is first delta-sigma modulated in 1. Bit-stream $X_n$ is shifted for 90° to obtain orthogonal bit-stream $X_d$. Shift circuit 2 is implemented as a delay line, which consists of serial connections of "D" flip-flops. For known nominal frequency Fn and sampling frequency Fs, one can calculate the number of "D" flip-flops (needed to achieve 90-degree shift) of circuit 2 using formula: $N=Fs/4Fn=Tn/4\ Ts$. Thus, for Fn=50 Hz, and Fs=100 KHz, N=500. Both $X_n$ and $X_d$ are added in the DA 3 one to obtain bit-stream A. This bit stream is a low-pass filtered (LPF) in 5 to obtain the analog signal s(t). This analog signal is compared with reference ground signal (zero line in FIG. 5) in comparator circuit 6 to obtain digital pulse stream C. A comparator C is a zero-crossing detector. Demodulated orthogonal signals ($X_n$ and $X_d$), output of LP filter 5 (bold signal s(t)), and output of comparator C (digital signal) are shown in FIG. 5. One can see, when the demodulated signal s(t) crosses zero line, a digital waveform is generated. When positive edge of digital signal C is detected in 10, it resets counter 12, and counter starts to count until next periodic pulse edge of signal C appears again. By counting the number of clock pulses $C_n$ in the "window" one can calculate the frequency of the source using formula $C_{count}=T_{in}/T_s=F_s/F_{in}$, where $T_{in}$ and $T_s$ are periods of input signal and sampling signal respectively. Digital circuits numerated from 10 to 14 can be implemented in many ways, and they are not a subject of this invention. A programmable 90-degree shift circuit (2 and 8) can be implemented in diverse ways. An example of implementation using delay line is shown in FIG. 4B. It consists of N-bit delay line, multiplexor, and address register. Operation of this circuit is well known to those skilled in the art of digital circuit design, and its operation is described in digital design books or on the Web. For known value of input frequency, Fn=50 Hz, and a sampling frequency of Fs=100 KHz the number of "D" flip-flops, needed to achieve 90-degree shift of signal $X_n$, is N=500. If the desired delay line has only four distinguished outputs, then an address code word is only four-bits long. Depending on application, and required resolution, one can envision different lengths of programable 90-degree phase shift circuit, and the corresponding length of address word.

FIG. 4A (switch 4 in position B) shows a block diagram of RE+DA method. $\Delta$-$\Sigma$ bit-stream $X_n$ is squared to obtain bit stream $R_n$, which is shifted for 90° in 8 to obtain orthogonal bit-stream $R_d$. Generation of the orthogonal sequence $R_d$ can be accomplished using identical circuit shown in FIG. 4B. Both $R_n$ and $R_d$ are added in delta adder 9 to obtain bit-stream B, which is LP filtered in 5 to obtain analog signal s(t). This signal is compared to reference of zero-crossing detector 6 to obtain digital signal C whose period is two times shorter than the period of digital signal shown in FIG. 5. In FIG. 6 operational waveforms of RE+DA method are shown: demodulated squared orthogonal sinusoidal signals $R_n$ and $R_d$, output signal of LPF s(t), and digital output C of comparator 6. Positive edges of signal C are detected in 10 to reset a counter 12. Because the duration of a period of binary pulses is now two times shorter, FIG. 6, the number of count is now $C_{count}=T_{in}/2T_s=F_s/2F_{in}$. Thus, RE+DA method is two times faster, because delay line of the circuit 8 is two times shorter than the delay line 2 of DA method. The rest of the circuits, for numerical display (blocks from 10 to 14) are well known in practice and literature and can be implemented in diverse ways, and they are not the subject of the invention.

Figure 7:
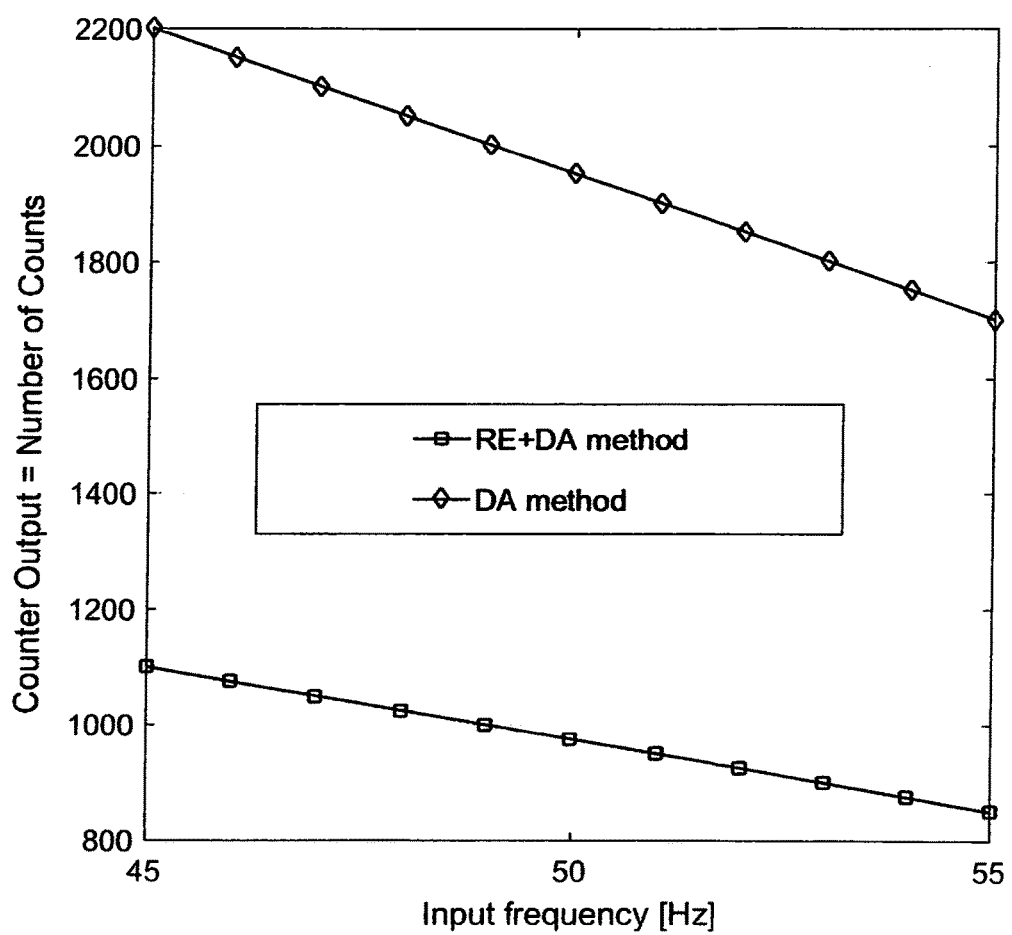
FIG. 7 shows the number of pulse counts as a function of deviation of nominal input frequency (50 Hz) in the range 45 Hz to 55 Hz.

In FIG. 7 the number of counts as a function of frequency deviation from nominal frequency (50 Hz), in the range 45 Hz to 55 Hz, is shown. One can conclude that the RE+DA method is two times faster than the DA method. However, the absolute error of the DA method shows a significant advantage over the RE+DA method. As can be seen from the Table 1 absolute error of the DA method is on average, less than 1 mHz, while for the RE+DA method absolute error is on average less than 4 mHz. In Table 1, measurement results are summarized for both methods which operate at two sampling frequencies of 100 KHz and 1 MHz. One can observe superior performances of DA method relative to the standard deviation.

TABLE 1

|  | F sampling | 100 kHz | 1 MHz |
|---|---|---|---|
| DA method | Average | 50.001 | 50.000 |
|  | St.dev. | 0.043 | 0.013 |
|  | min | 49.900 | 49.968 |
|  | max | 50.125 | 50.033 |
| RE + DA method | Average | 49.996 | 49.998 |
|  | St.dev. | 0.096 | 0.030 |
|  | min | 49.652 | 49.920 |
|  | max | 50.251 | 50.075 |

In FIG. 8 the block diagram of the frequency synchronization difference-meter is shown. It comprises of three or more identical $\Delta$-$\Sigma$ modulators. The reference modulator accepts stable reference signal $x_r(t)$ from geo-position system (GPS), or from some other stable frequency source. The rest of the modulators are in different geographical areas, which monitor input signals $x_1(t)$, $x_2(t)$, $x_3(t)$ . . . of respective frequency generators. Either method, DA or RE+DA, can be used. In FIG. 8 the method of DA is employed. Outputs of comparators C1, and C3 are fed into digital comparator circuits, and compared in digital comparators with reference bit-stream Cr of frequency Fr. Digital comparator circuits 6, 7, 8 and 9, 10, 11 can be implemented in diverse ways such as in [15] or [16]. In FIG. 8 a modified version of digital comparator is adopted [16]. Digital comparator circuit comprises of two 4-bit ring counters. Initially, the counters start from identical initial state "1000". One counter is clocked by Fr, and the other with F1 or F2. In FIG. 9 an example of synchronization of signal $x_1(t)$ with reference signal $x_r(t)$. Both signals have a nominal frequency of 50 Hz. Bold line in FIG. 9 presents a signal D1 (D1=0) at output of a digital comparator. FIG. 10 shows the case when frequency deviation of a signal $x_1(t)$ is 0.1 Hz (input frequency 49.9 Hz). One can see the appearance of pulse-stream when nominal reference and measured frequencies are in discrepancy. It is easy to conclude that digital pulse stream D1 (or D2) an be used for monitoring and synchronization of multiple frequency sources (power generators for example). Signal D1 can be averaged and fedback for control and synchronization purposes.

HOW TO USE THE INVENTION $\Delta$-$\Sigma$ modulation is high-resolution, low-power consuming, and inexpensive analog-to-digital converter (ADC). It is ideal ADC for interfacing purposes at low frequency and low-level sensing signals. It has a wide range of applications such as in instrumentation, industrial electronics, sensors, communication and control. The newly proposed methods, based on direct processing of $\Delta$-$\Sigma$ bit stream, can be used to measure frequency deviation of the source with a known nominal frequency in application such as power generators, EKGs, engine health monitoring, etc. The main distinction between the proposed method and a method proposed in US Patent No: 2006/011595 A1 is as follows:

US Patent No: 2006/011595 A1 is the modulation system meant for arbitrary signal transmission by digital radio, using two delta-sigma modulators, while the proposed system of this application is a deviation frequency detector, meant to detect frequency deviation of known nominal value. This information can be used for synchronization or control purposes of dislocated frequency generators.

US Patent No: 2006/011595 A1 is using principle of orthogonality of a carrier, which is well known in the field of analog and digital communications. A 90-degree phase difference of a carrier needs only to be approximately 90-degrees, while orthogonal operation of the proposed method is performed on the delta-sigma pulse stream (on information, not on a clock), and the design of the 90-shift circuit (length of shift register and the length of address word) is dependent on the frequency of input signal, and clock frequency of a delta-sigma modulator. A frequency of input signal must be known, while in US Patent No: 2006/011595 A1 modulate a frequency of an arbitrary signal source and shifting it to high frequency radio bandwidth. Thus, proposed instrument of this application detects discrepancy between two orthogonal signals of the same source, and detected signal s(t) it is low frequency signal.

US Patent No: 2006/011595 A1 is using radio carrier frequencies (order of hundreds of MHz), while the proposed frequency deviation detector uses a clock of order of hundreds of KHz. With clock frequency of 1 MHz, deviation of frequency source less than 1 mHz can be detected. From implementation and power consumption point of view the proposed apparatus of this application has advantage over US Patent No: 2006/011595 A1 as well.

Implementation of the proposed instrument is based on linear, and nonlinear arithmetic operation on delta-sigma bit-stream, using digital circuits of delta adder and circuit for squaring operation (RE), while in US Patent No: 2006/011595 A1 uses classic design with analog summing amplifier, band-pass filter (BPF), and antenna.

US Patent No: 2006/011595 A1 uses two delta-sigma modulators with arbitrary input signals for transmission over dedicated single radio link. Proposed method of this application uses a reference generator of the same known nominal frequency (say 50 Hz) to synchronize two or more dislocated frequency sources of the same nominal frequency (say power generators in different geographical location). Interface of proposed instrument with a reference GPS system can be achieved through dedicated communication links.

US Patent No: 2006/011595 A1 presents a typical orthogonal carrier communication transmission system based on direct modulation (transmission) of a delta-sigma bit stream, while the proposed method of this application is a typical instrumentation-measurement system based on non-conventional processing (linear and non-linear) of orthogonal bit-stream of one delta modulator. Any change of frequency of known value causes the violation of orthogonality law. A violation signal is detected at the output of the delta adder (DA) and further processed to obtain a quantitative vale of deviation of frequency of known nominal value. Obtained violation signal can be used for control and synchronization purposes, or transmitted to control center via dedicated communication line.

Thus, it will be appreciated by those skilled in the art that the present invention is not restricted to the preferred uses described with references to the drawings, and that variations may be made therein without departing from the scope of the present invention.

What is claimed is:

1. A digital programable frequency meter for low frequencies with known nominal values, the frequency meter circuit comprising:
   a first or higher order $\Delta$-$\Sigma$ modulator for producing bit-stream Xn;
   a delay line to produce 90° shifted signal Xd;
   a delta adder (DA) for addition of orthogonal bit-streams Xn and Xd, and produce signal A;
   a low-pass filter (LPF) to receive digital signal A, and produce analog signal s(t);
   a comparator C (zero-crossing detector) compares signal s(t) with a ground (zero voltage) to produce digital output C;
   a positive edge of digital signal C is detected to reset a counter, which counts a number of a clock pulses between positive edges of the digital signal C;
   a Count-to-Frequency converter, with display, serves for numerical display of a frequency deviation of an input signal x(t).

2. A digital programable frequency meter for low frequencies with known nominal values, the frequency meter circuit comprising:
   a first or higher order $\Delta$-$\Sigma$ modulator for producing bit-stream Xn;
   a rectifying encoder (RE) circuit to produce square signal of Rn;
   a delay line to produce orthogonal signal Rd;
   a delta adder DA for addition of orthogonal bit-streams Rn and Rd, and produce signal B;
   a low-pass filter to receive digital signal B, and produce analog signal s(t);
   a comparator (a zero-crossing detector) C compares signal s(t) with a ground (zero voltage) to produce digital output C;
   a positive edge of digital signal C is detected to reset a counter, which counts a number of a clock pulses between positive edges of the digital signal C;
   a Count-to-Frequency converter, with display, serves for numerical display of a frequency deviation of an input signal x(t).

3. A digital programmable frequency synchronization difference-meter, comprising:
   a two (or more) identical first or higher order $\Delta$-$\Sigma$ modulators, converting input signals x1(t) and x2(t) of unstable frequency;
   a reference $\Delta$-$\Sigma$ modulator; of a stable clock frequency, and a stable frequency of reference signal $x_r(t)$;
   a two (or more) DA circuits (or DA+RE circuits) for producing bit-streams C1, Cr, and C2 of a corresponding bit-stream frequencies F1, Fr, and F2;
   a two (or more) digital comparators for producing a difference signal between a reference bit-stream of a stable frequency Fr, and a bit-stream of an unstable frequency F1 (signal D1) or the reference bit-stream of a stable frequency Fr, and a bit-stream of an unstable frequency F2 (signal D2).

* * * * *